United States Patent
Hong et al.

(10) Patent No.: US 8,953,378 B2
(45) Date of Patent: Feb. 10, 2015

(54) SPLIT GATE PROGRAMMING

(75) Inventors: Cheong Min Hong, Austin, TX (US);
Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 405 days.

(21) Appl. No.: 13/536,307

(22) Filed: Jun. 28, 2012

(65) Prior Publication Data
US 2014/0003155 A1 Jan. 2, 2014

(51) Int. Cl.
*G11C 11/34* (2006.01)

(52) U.S. Cl.
USPC ............ 365/185.18; 365/185.14; 365/185.19; 365/185.22

(58) Field of Classification Search
USPC .............. 365/185.18, 185.14, 185.19, 185.22
See application file for complete search history.

(56) References Cited

U.S. PATENT DOCUMENTS

2002/0175394 A1* 11/2002 Wu et al. ........................ 257/510
2005/0237816 A1* 10/2005 Lue et al. ................. 365/185.28

OTHER PUBLICATIONS

Stefanutti, W., et al., "Monte Carlo Simulation of Substrate Enhanced Electron Injection in Split-Gate Memory Cells", IEEE Transactions on Electron Devices, vol. 53, No. 1, Jan. 2006, pp. 89-96.
Weltzer, L.M., et al., "Enhanced Chisel Programming in Flash Memory Devices with SiGe Buried Layer", IEEE, Non-Volatile Memory Technology Symposium, 2004, pp. 31-33.

\* cited by examiner

*Primary Examiner* — Vu Le
*Assistant Examiner* — Han Yang

(57) ABSTRACT

A method for programming a split gate memory cell includes performing a first programming of the split gate memory cell in a first programming cycle of the split gate memory cell; and, subsequent to the performing the first programming of the split gate memory cell, performing a second programming of the split gate memory cell in the first programming cycle, wherein the first programming is characterized as one of source-side injection (SSI) programming and channel-initiated secondary electron (CHISEL) programming, and the second programming is characterized as the other of SSI programming and CHISEL programming.

20 Claims, 2 Drawing Sheets

SPLIT GATE PROGRAMMING

BACKGROUND

1. Field

This disclosure relates generally to split gate memories, and more specifically, to programming of split gate memories.

2. Related Art

Split gate memories are a type of non-volatile memory (NVM) that have, between the doped regions that are for use as sources and drains, a control gate and a select gate. The control gate is over the storage medium that may be a floating gate or a thin film storage layer of nanocrystals or nitride. The select gate is coupled to a word line and a bit line for selecting when the memory cell is to be read or programmed. A benefit of the split gate memory is low power programming and thus is better for low power applications. As is typical of NVM cells in general, endurance and data retention are important issues. Data retention, the time a cell will retain enough charge to be reliably read after programming, may be decisive in determining suitability for a particular use. For some automotive applications, data retention is exceptionally important. A cheaper solution may be of little consequence if the data retention requirement is not met. Use of nanocrystals helps because a weak spot that provides leakage may only affect a single nanocrystal while the others continue to hold charge and thus provide for the ability to be reliably read. No current leakage at all from a given nanocrystal, however, is difficult to achieve. Thus data retention of split gate memories still needs improvement in order to be usable in some applications.

Accordingly there is a need to provide for better data retention for split gate memories.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a split gate memory cell is programmed using a programming technique that results in a first portion of the charge storage layer storing charge under control gate and a different programming technique that results in a second portion of the charge storage layer under the control gate, different from the first portion, storing charge. A benefit of this is providing better data retention. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
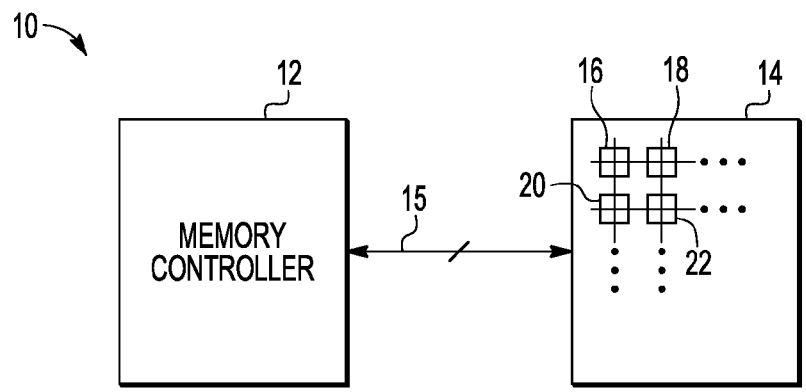
FIG. 1 is a block diagram of a memory having split gate memory cells according to an embodiment.
Figure 2:
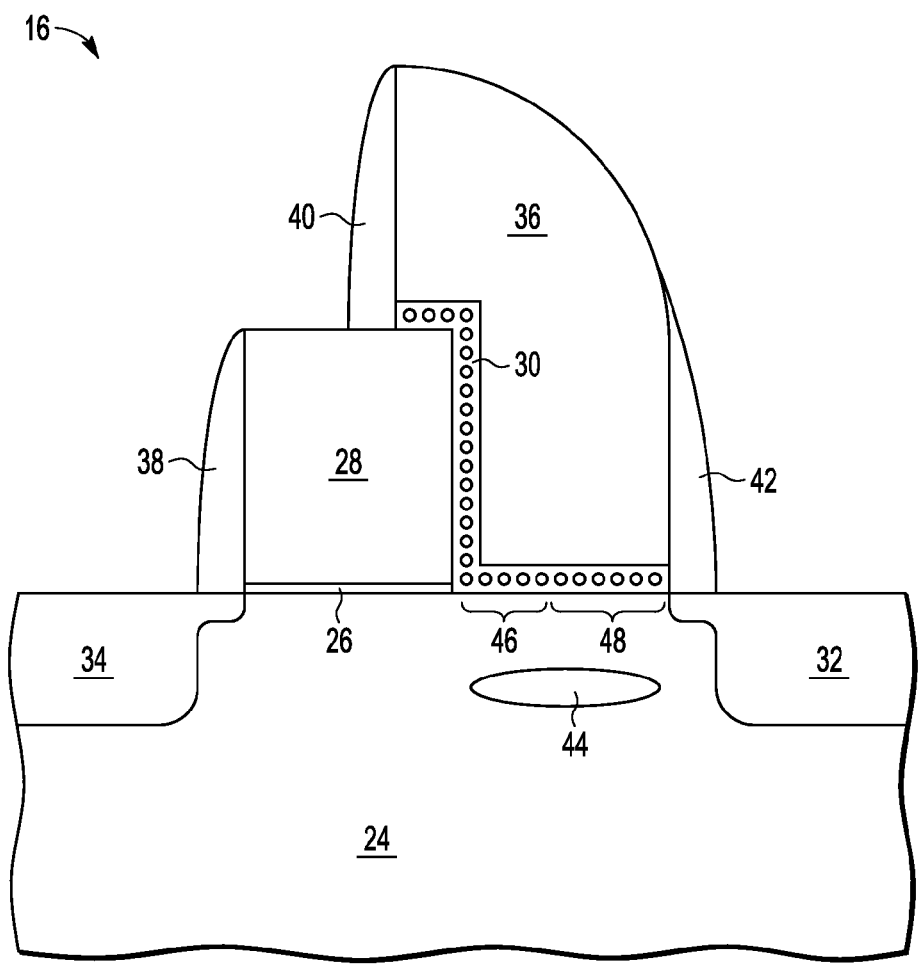
FIG. 2 is a cross section of a split gate memory cell from the memory of FIG. 1.

Shown in FIG. 1 is a memory 10 having a memory controller 12 coupled by a bus 15 to an array 14 of non-volatile memory (NVM) cells that are of the split gate type. Shown in array 14 are exemplary NVM cells 16, 18, 20, and 22. Memory controller 12 controls the operation of array including erasing, programming, and reading so that many signals, such as control signals, programming and erase signals, address signals, and data signals, are transferred between memory controller 12 and array 14.

Shown is NVM cell 16 having a substrate 24, a gate dielectric 26, a select gate 28 on gate dielectric 26, a thin film storage layer 30 on substrate 24 adjacent to select gate 28 as well as along a sidewall of and on top of a portion of select gate 28, a control gate 36 on thin film storage layer 30, a doped region 32 in substrate 24 substantially aligned to an edge of control gate 36 away from select gate 28, a doped region 34 in substrate 24 substantially aligned to an edge of select gate 28 away from control gate 36, a sidewall spacer 38 along the edge of select gate 28, a sidewall spacer 42 along the edge of control gate 36, and a sidewall spacer 40 along a sidewall of control gate 36 that is over select gate 28, and a buried layer 44 in substrate 24 spaced below thin film storage layer 30 and under control gate 36. Except for buried layer 44, NVM cell 16 is conventional. Buried layer 44 may be of a silicon germanium (SiGe) layer that is formed by implanting germanium into substrate 24. A photoresist mask may be used otherwise for the germanium implant. An anneal is performed after the germanium implant. Buried layer 44 is in electrical contact with substrate 24 due to being the same conductivity type, which is P in this example. In this example doped regions 32 and 34 are N type. A first portion 46 of thin film storage layer 30 is below control gate 36 and nearest select gate 28. A second portion 48 of thin film storage layer 30 is below control gate 36 and nearest doped region 32. In this example of thin film storage layer 30 having nanocrystals, first portion 46 has the nanocrystals that are below control gate 36 and nearest select gate 28.

There are two types of programming that are performed on the cells, including NVM cell 16, of array 14 by memory controller 12. Programming is performed to raise the threshold voltage of the NVM cells selected for programming to have a sufficiently high threshold voltage that can be reliably detected to determine that programming has occurred. One type of programming is source side injection (SSI) and the other is channel-initiated secondary electron (CHISEL) programming. An example of SSI is to apply 9 volts to control gate 36, 5 volts to doped region 32, ground to substrate 24 and thus buried layer 44, ground to doped region 34, and 0.9 volt to select gate 28. This results in electrons flowing from doped region 34 to doped regions 32 with some electrons being attracted to first portion 46. The nanocrystals in portion 46 eventually reach a point where additional accumulation of electrons becomes very slow and are considered saturated. Any further increase in threshold voltage will be too slow to have practical benefit.

CHISEL programming may be performed by applying 6 volts to the control gate, 3 volts to doped region 32, −3 volts to substrate 24 and thus buried layer 44, ground to doped region 34, and 1.2 volts to select gate 28. This also results in electron flow from doped region 34 to doped region 32. In this case the electrons are less attracted to first portion 46. When the electrons reach nearer doped region 32 and under second portion 48. Electron/hole pairs are created at this point near doped region 32 with the holes be attracted to and collected at buried layer which has a negative voltage. With the holes of the electron/hole pairs being removed, the freed electrons from these electron/hole pairs are then attracted to the nanocrystals in second portion 48. This process of accumulation of electrons in second portion 48 by CHISEL is slower than accumulation of electrons in first portion 46 by SSI but can eventually result in a higher threshold voltage than is typically reached using SSI. Although holes can be absorbed by grounded substrate 24, buried layer 44 with germanium has a smaller band gap than silicon so that holes are more readily absorbed there than in the substrate which is typically silicon.

Reading is achieved with doped region 34 at a positive power supply voltage which may be referenced as VDD, a reference voltage applied to control gate that is between the erased threshold voltage and the programmed threshold voltage, substrate 24 is at ground, and select gate 28 at VDD. Select gate 28 may be coupled to a word line and doped region 34 coupled to a bit line. Erasing may be achieved by applying 14 volts at control gate 36, 1 volt at select gate 28, ground at substrate 24, and ground at doped regions 32 and 34.

Figure 3:
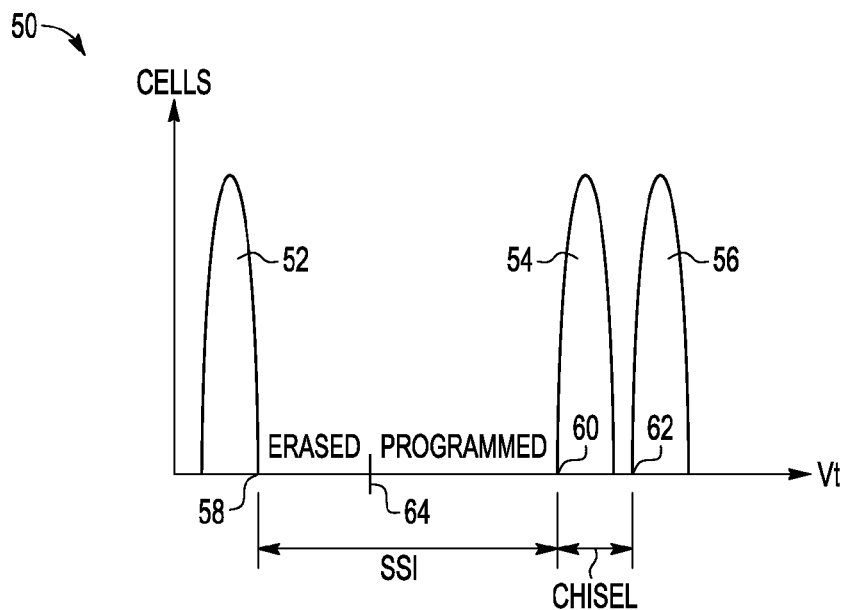
FIG. 3 is a diagram showing a threshold voltage distribution of split gate memory cells in stages.

Shown in FIG. 3 is a chart 50 showing a distribution 52 of erased bits having a least erased bit at a threshold voltage 58. Threshold voltage 58 is at least a desired margin below threshold voltage 64 which is the threshold voltage that differentiates between programmed and erased. After performing SSI, the least programmed cell as shown in distribution 54 has threshold voltage 60 which preferably is a safe margin above threshold voltage 64. Leakage, however, will lower the threshold voltage. CHISEL is then performed to extend the least programmed bit to have an increased threshold voltage of threshold voltage 62. Starting with a higher threshold voltage extends the time before the leakage lowers the threshold voltage to a point that it cannot be reliably read as programmed. Threshold voltage 62 is related to data retention so that threshold voltage 62 can be adjusted within some range to alter the data retention characteristic.

Figure 4:
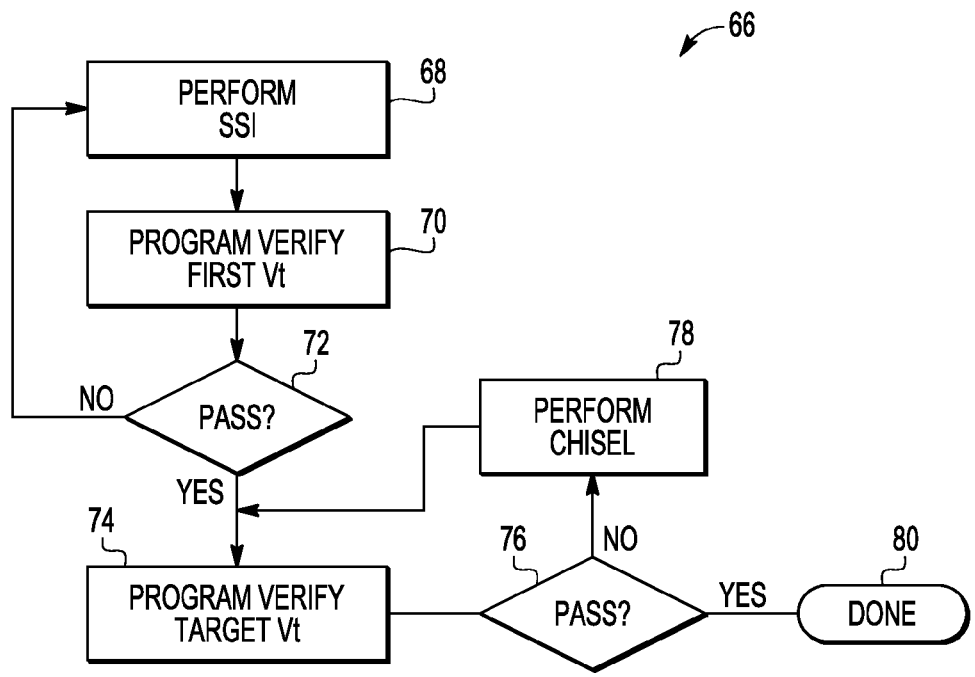
FIG. 4 is a flow chart showing a programming operation of the memory of FIG. 1.

Shown in FIG. 4 is a flow chart showing a method 66 for programming memory NVM cells such as NVM cell 16. As shown in FIG. 4 at step 68, a programming step of SSI is performed. This step can include a predetermined number of pulses applied to the control gate while holding the other voltages constant. At step 70 a program verify is performed to determine if all of the NVM cells have been programmed to at least a first threshold voltage (Vt) that is sufficient for reliably reading. If no, then SSI programming is performed again. This cycle of SSI programming and verification continues until the least programmed NVM cell has the first Vt. The first Vt does not need to be measured directly. The determination in step 70 may be best achieved by current sensing using a predetermined voltage for the select gate. When the current drops below a reference level then it is known that the NVM cell has at least the first Vt. This cycle of SSI programming and verification can reach an excessive amount and the programming is considered a failure. This would normally be caught during wafer probe before the memory is even packaged. For a device that has passed wafer probe, there would normally be a point at which verification that all of the NVM cells have at least the first Vt is achieved. After all of NVM cells have at least reached the first Vt, another verification, step 74, is performed for a target Vt that is greater than the first Vt. This verification is again most likely best performed indirectly using current sensing. If all of the NVM cells have at least the target Vt, they are determined to have passed as shown in step 76. If they all pass, then programming is done as shown in step 80. If at step 76 it is determined that not all of the NVM cells have at least the target Vt, then a programming step using CHISEL programming, as shown in step 78, is performed on at least the NVM cells that do not have at least the target Vt. After the CHISEL programming of step 78, verification as shown in step 74 is again performed to determine if there are any remaining NVM cells that do not have at least the target Vt. The cycle of performing CHISEL programming and verification of at least meeting the target Vt continues until all of the NVM cells have at least the target Vt. If the number of cycles becomes too large before this achieved, then the programming may be considered a failure. This type of failure may addressed in any number of ways as are currently known for a failure to program. Most likely only a few of the NVM cells would cause this failure and thus the memory could be left functioning with those NVM cells mapped out of the address space. Until such a failure, there will a point at which all of the NVM cells will have at least the target Vt and the programming is done as shown in step 80. This shows that sequentially performing the SSI and CHISEL programming can result in a higher threshold voltage for the least programmed NVM cell and thus provide for higher data retention.

There are a number of variations on method 66 that may obtain at least some of the benefits of method 66. For example, instead of performing the SSI first, CHISEL programming may be performed first followed by SSI programming. This may be slower than method 66 but would still may be effective and may have other benefits. Also the SSI then CHISEL approach may be used for a certain number of program/erase cycles, for example 5000 cycles, then the order may be switched to CHISEL followed by SSI programming for subsequent program/erase cycles. Also details may be altered such as the target Vt may be first verified if there is reasonable likelihood that will occur. In such case there is an immediate pass to done 80. If that fails then the verification is if the first Vt is met followed by additional SSI programming steps if necessary then followed by CHISEL programming. Also it may be feasible to simply sequentially perform the SSI and CHISEL programming then performing the first verification after both of those have been performed.

By now it should be appreciated that there has been provided a method for programming a split gate memory cell. The method includes performing a first programming of the split gate memory cell in a first programming cycle of the split gate memory cell. The method further includes subsequent to the performing the first programming of the split gate memory cell, performing a second programming of the split gate memory cell in the first programming cycle, wherein the first programming is characterized as one of source-side injection (SSI) programming and channel-initiated secondary electron (CHISEL) programming, and the second programming is characterized as the other of SSI programming and CHISEL programming. The method may have a further characterization by which wherein the step of performing the first programming results in the split gate memory cell having a first threshold voltage, and the step of performing the second programming increases the first threshold voltage of the split gate memory cell to a second threshold voltage. The method may have a further characterization by which the step of performing the first programming is formed for a first predetermined time period, and the step of performing the second programming is performed after the first predetermined time period for a second predetermined time period. The method may further include after the step of performing the second programming, verifying the second threshold voltage with a target threshold voltage and when the second threshold voltage is less than the target threshold voltage, performing additional programming of the split gate memory cell in the first programming cycle using the other one of the SSI programming and CHISEL programming. The method may further include after the step of performing the first programming, verifying the first threshold voltage with a first target threshold voltage and after the step of performing the second programming, verifying the second threshold voltage with a second target threshold voltage, greater than the first target threshold voltage. The method may further include when the first threshold voltage is less than the first target threshold voltage, performing additional programming of the split gate memory cell using the one of the SSI programming and CHISEL programming prior to the step of performing the second programming and when the second threshold voltage is less than the second target threshold voltage, performing additional programming of the split gate memory cell using the other one of the SSI programming and CHISEL programming. The method may have a further characterization by which the split gate memory cell includes a select gate over a substrate, a nanocrystal layer adjacent a sidewall of the select gate and extending over the substrate laterally adjacent the select gate, a control gate adjacent the sidewall of the select gate and over the nanocrystal layer extending laterally adjacent the select gate, a first source/drain region in the substrate laterally adjacent the control gate, a second source/drain region in the substrate laterally adjacent the select gate, and a buried layer within the substrate below the control gate and the nanocrystal layer extending laterally adjacent the select gate, and wherein, during the step of performing the CHISEL programming, the buried layer enhances electron hole pair generation. The method may have a further characterization by which the substrate comprises silicon and the buried layer of the split gate memory cell comprises silicon germanium. The method may have a further characterization by which the first source/drain region extends deeper into the substrate than the buried layer. The method may have a further characterization by which the first programming is characterized as SSI programming and the second programming is characterized as CHISEL programming.

Also disclosed is a method for programming a split gate memory cell. The method includes performing an SSI programming of the split gate memory cell in a first programming cycle of the split gate memory cell. The method further includes subsequent to the performing the SSI programming of the split gate memory cell, determining whether the SSI programming passes or fails a verification using a target threshold voltage. The method further includes selectively performing a CHISEL programming of the split gate memory cell in the first programming cycle based on whether the SSI programming passes or fails the verification, wherein when the SSI programming fails the verification, a CHISEL programming of the split gate memory cell is performed in the first programming cycle and when the SSI programming passes the verification, a CHISEL programming of the split gate memory cell is not performed in the first programming cycle. The method may have a further characterization by which, prior to the step of determining whether the SSI programming passes or fails the verification using the target threshold voltage, the method further includes determining whether the SSI programming passes or fails the verification using a first threshold voltage which is less than the target threshold voltage and when the SSI programming fails the verification, performing an additional SSI programming of the split gate memory cell in the first programming cycle. The method may have a further characterization by which the split gate memory cell further includes a select gate over a substrate, a charge storage layer overlapping a sidewall of the select gate and extending over the substrate laterally adjacent the select gate, a control gate overlapping the sidewall of the select gate and over a nanocrystal layer and extending laterally adjacent the select gate, and a buried layer within the substrate below the control gate and the charge storage layer extending laterally adjacent the select gate, wherein, during CHISEL programming, the buried layer enhances electron hole pair generation.

Disclosed also is a memory including a memory array including a plurality of split gate memory cells. Each of the split gate memory cells includes a select gate over a substrate, a charge storage layer adjacent a sidewall of the select gate and extending over the substrate laterally adjacent the select gate, a control gate adjacent the sidewall of the select gate and over the charge storage layer extending laterally adjacent the select gate, a first source/drain region in the substrate laterally adjacent the control gate, and a second source/drain region in the substrate laterally adjacent the select gate. The memory further includes a memory controller, wherein, for each split gate memory cell, the memory controller performs an SSI programming and a CHISEL programming of the split gate memory cell within a same programming cycle. The memory system may have a further characterization by which the memory controller performs the SSI programming to achieve a first threshold voltage and subsequently performs the CHISEL programming to increase the first threshold voltage. The memory system may have a further characterization by which the memory controller, after performing the CHISEL programming, verifies a resulting threshold voltage of the split gate memory cell with a target threshold voltage, wherein when the resulting threshold voltage is less than the target threshold voltage, the memory controller performs additional CHISEL programming of the split gate memory cell in the same programming cycle. The memory system may have a further characterization by which the memory controller, after performing the SSI programming, verifies a first resulting threshold voltage with a first target threshold voltage and when the first resulting threshold voltage is less than the first target threshold voltage, the memory controller performs additional SSI programming of the split gate memory cell in the same programming cycle. The memory system may have a further characterization by which the memory controller, after performing the CHISEL programming, verifies a second resulting threshold voltage with a second target threshold voltage, greater than the first target threshold voltage, and when the second resulting threshold voltage is less than the second target threshold voltage, the memory controller performs additional CHISEL programming of the split gate memory cell in the same programming cycle. The memory system may have a further characterization by which the split gate memory cell comprises a buried layer within the substrate below the control gate and the charge storage layer extending laterally adjacent the select gate, and wherein, during the step of performing the CHISEL programming, the buried layer enhances electron hole pair generation. The memory system may have a further characterization by which the substrate comprises silicon and the buried layer of the split gate memory cell comprises silicon germanium.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other variations in method 66 than those described may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for programming a split gate memory cell, the method comprising:
    performing a first programming of the split gate memory cell in a first programming cycle of the split gate memory cell; and
    subsequent to the performing the first programming of the split gate memory cell, performing a second programming of the split gate memory cell in the first programming cycle, wherein the first programming is characterized as one of source-side injection (SSI) programming and channel-initiated secondary electron (CHISEL) programming, and the second programming is characterized as the other of SSI programming and CHISEL programming.

2. The method of claim 1, wherein the step of performing the first programming results in the split gate memory cell having a first threshold voltage, and the step of performing the second programming increases the first threshold voltage of the split gate memory cell to a second threshold voltage.

3. The method of claim 2, wherein the step of performing the first programming is formed for a first predetermined time period, and the step of performing the second programming is performed after the first predetermined time period for a second predetermined time period.

4. The method of claim 3, further comprising:
    after the step of performing the second programming, verifying the second threshold voltage with a target threshold voltage;
    when the second threshold voltage is less than the target threshold voltage, performing additional programming of the split gate memory cell in the first programming cycle using the other one of the SSI programming and CHISEL programming.

5. The method of claim 2, further comprising:
    after the step of performing the first programming, verifying the first threshold voltage with a first target threshold voltage; and
    after the step of performing the second programming, verifying the second threshold voltage with a second target threshold voltage, greater than the first target threshold voltage.

6. The method of claim 5, further comprising:
    when the first threshold voltage is less than the first target threshold voltage, performing additional programming of the split gate memory cell using the one of the SSI programming and CHISEL programming prior to the step of performing the second programming; and
    when the second threshold voltage is less than the second target threshold voltage, performing additional programming of the split gate memory cell using the other one of the SSI programming and CHISEL programming.

7. The method of claim 1, wherein the split gate memory cell comprises:
    a select gate over a substrate;
    a nanocrystal layer adjacent a sidewall of the select gate and extending over the substrate laterally adjacent the select gate;
    a control gate adjacent the sidewall of the select gate and over the nanocrystal layer extending laterally adjacent the select gate;
    a first source/drain region in the substrate laterally adjacent the control gate;
    a second source/drain region in the substrate laterally adjacent the select gate; and
    a buried layer within the substrate below the control gate and the nanocrystal layer extending laterally adjacent the select gate, and wherein, during the step of performing the CHISEL programming, the buried layer enhances electron hole pair generation.

8. The method of claim 7, wherein the substrate comprises silicon and the buried layer of the split gate memory cell comprises silicon germanium.

9. The method of claim 7, wherein the first source/drain region extends deeper into the substrate than the buried layer.

10. The method of claim 1, wherein the first programming is characterized as SSI programming and the second programming is characterized as CHISEL programming.

11. A method for programming a split gate memory cell, the method comprising:
    performing an SSI programming of the split gate memory cell in a first programming cycle of the split gate memory cell;
    subsequent to the performing the SSI programming of the split gate memory cell, determining whether the SSI programming passes or fails a verification using a target threshold voltage; and
    selectively performing a CHISEL programming of the split gate memory cell in the first programming cycle based on whether the SSI programming passes or fails the verification, wherein:

when the SSI programming fails the verification, a CHISEL programming of the split gate memory cell is performed in the first programming cycle, and when the SSI programming passes the verification, a CHISEL programming of the split gate memory cell is not performed in the first programming cycle.

12. The method of claim 11, wherein prior to the step of determining whether the SSI programming passes or fails the verification using the target threshold voltage, the method further comprises:

determining whether the SSI programming passes or fails the verification using a first threshold voltage which is less than the target threshold voltage; and when the SSI programming fails the verification, performing an additional SSI programming of the split gate memory cell in the first programming cycle.

13. The method of claim 11, wherein the split gate memory cell further comprises:

a select gate over a substrate;

a charge storage layer overlapping a sidewall of the select gate and extending over the substrate laterally adjacent the select gate;

a control gate overlapping the sidewall of the select gate and over a nanocrystal layer and extending laterally adjacent the select gate; and a buried layer within the substrate below the control gate and the charge storage layer extending laterally adjacent the select gate, wherein, during CHISEL programming, the buried layer enhances electron hole pair generation.

14. A memory system comprising:

a memory array comprising a plurality of split gate memory cells, wherein each of the split gate memory cells comprises:

a select gate over a substrate, a charge storage layer adjacent a sidewall of the select gate and extending over the substrate laterally adjacent the select gate, a control gate adjacent the sidewall of the select gate and over the charge storage layer extending laterally adjacent the select gate, a first source/drain region in the substrate laterally adjacent the control gate, a second source/drain region in the substrate laterally adjacent the select gate; and a memory controller, wherein, for each split gate memory cell, the memory controller performs an SSI programming and a CHISEL programming of the split gate memory cell within a same programming cycle.

15. The memory system of claim 14, wherein the memory controller performs the SSI programming to achieve a first threshold voltage and subsequently performs the CHISEL programming to increase the first threshold voltage.

16. The memory system of claim 14, wherein the memory controller, after performing the CHISEL programming, verifies a resulting threshold voltage of the split gate memory cell with a target threshold voltage, wherein when the resulting threshold voltage is less than the target threshold voltage, the memory controller performs additional CHISEL programming of the split gate memory cell in the same programming cycle.

17. The memory system of claim 14, wherein the memory controller, after performing the SSI programming, verifies a first resulting threshold voltage with a first target threshold voltage and when the first resulting threshold voltage is less than the first target threshold voltage, the memory controller performs additional SSI programming of the split gate memory cell in the same programming cycle.

18. The memory system of claim 17, wherein the memory controller, after performing the CHISEL programming, verifies a second resulting threshold voltage with a second target threshold voltage, greater than the first target threshold voltage, and when the second resulting threshold voltage is less than the second target threshold voltage, the memory controller performs additional CHISEL programming of the split gate memory cell in the same programming cycle.

19. The memory system of claim 14, wherein the split gate memory cell comprises a buried layer within the substrate below the control gate and the charge storage layer extending laterally adjacent the select gate, and wherein, during the step of performing the CHISEL programming, the buried layer enhances electron hole pair generation.

20. The memory system of claim 19, wherein the substrate comprises silicon and the buried layer of the split gate memory cell comprises silicon germanium.

* * * * *